（12）United States Patent
Hung et al.

(10) Patent No.: US 12,369,391 B2
(45) Date of Patent: Jul. 22, 2025

(54) LAYOUT PATTERN OF SEMICONDUCTOR VARACTOR AND FORMING METHOD THEREOF

(71) Applicant: UNITED MICROELECTRONICS CORP., Hsin-Chu (TW)

(72) Inventors: Ching-Wen Hung, Tainan (TW); Peng-Hsiu Chen, Tainan (TW); Su-Ming Hsieh, Tainan (TW); Ying-Ren Chen, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 310 days.

(21) Appl. No.: 18/098,710

(22) Filed: Jan. 19, 2023

(65) Prior Publication Data

US 2024/0222369 A1    Jul. 4, 2024

(30) Foreign Application Priority Data

Dec. 28, 2022  (TW) .................................. 111150273

(51) Int. Cl.
*H10D 84/00* (2025.01)
*H10D 1/00* (2025.01)
*H10D 1/64* (2025.01)

(52) U.S. Cl.
CPC ........... *H10D 84/215* (2025.01); *H10D 1/045* (2025.01); *H10D 1/64* (2025.01)

(58) Field of Classification Search
CPC ........... H01L 27/0808; H01L 29/66174; H01L 29/93; H01L 27/0629; H01L 27/0207; H01L 29/94; H01L 21/82; H01L 27/105; H01L 29/423; H01L 29/49
See application file for complete search history.

(56) References Cited

U.S. PATENT DOCUMENTS

| | | | |
|---|---|---|---|
| 9,184,256 B2 | 11/2015 | Huang | |
| 9,343,552 B2 | 5/2016 | Chen | |
| 2014/0264628 A1 | 9/2014 | Lin | |
| 2015/0228649 A1* | 8/2015 | Singh | H01L 21/823431 438/283 |
| 2022/0208957 A1 | 6/2022 | Chan | |
| 2022/0399266 A1* | 12/2022 | Song | H10D 84/0149 |

FOREIGN PATENT DOCUMENTS

CN           102129481        11/2015

OTHER PUBLICATIONS

Jing Jing et al., Novel MOS Varactor Device Optimization and Modeling for High-Speed Transceiver Design in FinFET Technology, IEDM16-699, p. 28.5.1-p. 28.5.4, XP033055060, 2016 IEEE, Xilinx Inc., USA, Dec. 3, 2016.

* cited by examiner

Primary Examiner — Mohammad A Rahman
(74) Attorney, Agent, or Firm — Winston Hsu

(57) ABSTRACT

The invention provides a layout pattern of a semiconductor varactor, which comprises a plurality of varactor units arranged on a substrate, wherein each varactor unit comprises a plurality of fin structures arranged in parallel with each other, a plurality of gate structures arranged in parallel with each other, located on the substrate and spanning the fin structures, and a gate metal layer electrically connected with the plurality of gate structures.

16 Claims, 4 Drawing Sheets

LAYOUT PATTERN OF SEMICONDUCTOR VARACTOR AND FORMING METHOD THEREOF

BACKGROUND OF THE INVENTION

1. Field of the Invention

The invention relates to the semiconductor field, in particular to a layout pattern of a metal-insulating-silicon varactor (MISVAR for short) and a manufacturing method thereof.

2. Description of the Prior Art

A varactor is a semiconductor device with a voltage-sensitive capacitance. Usually, the space charge area on the semiconductor surface in contact with the insulator vary with the applied voltage to generate bias-dependent capacitance.

In many electronic circuits, the variability of capacitance in varactors can be advantageously used to provide useful functions in amplifiers, oscillators and frequency synthesizers. For example, varactor can be used to construct voltage-controlled oscillators (VCO), which can generate an adjustable stable frequency without using a circuit with multiple oscillators.

In addition, many semiconductor circuits need varactors and linear capacitors. Therefore, varactor with large capacitance variation range or with less leakage current is one of the development directions of varactor.

SUMMARY OF THE INVENTION

The invention provides a layout pattern of a semiconductor varactor, which comprises a plurality of varactor units arranged on a substrate, wherein each varactor unit comprises a plurality of fin structures arranged in parallel with each other, a plurality of gate structures arranged in parallel with each other, located on the substrate and spanning the fin structures, and a gate metal layer electrically connected with the plurality of gate structures.

The invention also provides a manufacturing method of the layout pattern of the semiconductor varactor, which comprises forming a plurality of varactor units arranged on a substrate, wherein each varactor unit comprises a plurality of fin structures arranged in parallel with each other, a plurality of gate structures arranged in parallel with each other, located on the substrate and spanning the fin structures, and a gate metal layer electrically connected with the plurality of gate structures.

The feature of the present invention is to provide a novel metal-insulating-silicon varactor (MISVAR), which has a plurality of varactor units arranged on a substrate along a first direction (e.g., Y direction), and a plurality of gate structures arranged along a second direction (e.g., X direction) in each varactor unit. Increasing the number of gate structures will also help to increase the capacitance change range of varactor, and make the capacitance value change more obviously under different voltage frequencies. In other words, the present invention provides a novel layout pattern of a MISVAR and its manufacturing method.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
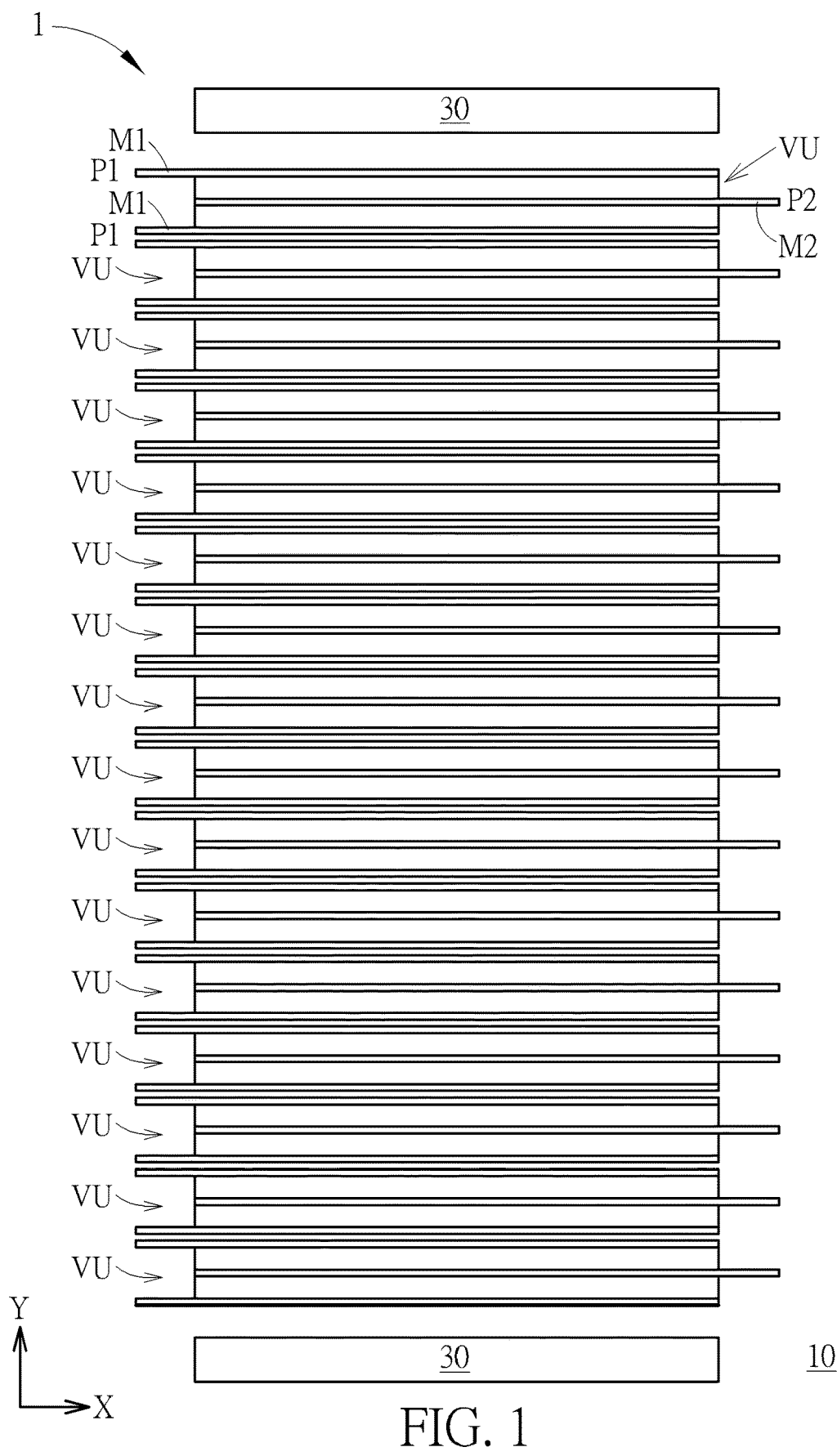
FIG. 1 shows a schematic top view of a metal-insulating-silicon varactor (MISVAR) according to an embodiment of the present invention.

Please refer to FIG. 1, which shows a schematic top view of a metal-insulating-silicon varactor (MISVAR) according to an embodiment of the present invention. As shown in FIG. 1, a metal-insulator-silicon varactor (MISVAR) 1 includes a plurality of varactor units VU arranged on a substrate 10, wherein each varactor unit VU includes an active region (which may be a planar doped region or a plurality of fin structures), a plurality of first gates and metal layers M1 and M2, which will be described in the following paragraphs. As shown in FIG. 1, the metal layer M1 and the metal layer M2 are connected to two ports at both ends of the metal-insulator-silicon varactor 1, which are the first port P1 and the second port P2, respectively, and the capacitance value of the varactor 1 is changed by inputting different voltages from the first port P1 and the second port P2. In this embodiment, a plurality of varactor units VU are arranged along a first direction (e.g., Y direction), and two sides of the varactor units VU (e.g., the top and bottom in FIG. 1) further include well pickup structures 30 for inputting bias voltage or grounding to maintain the potential between the metal layer and the substrate 10.

Figure 2:
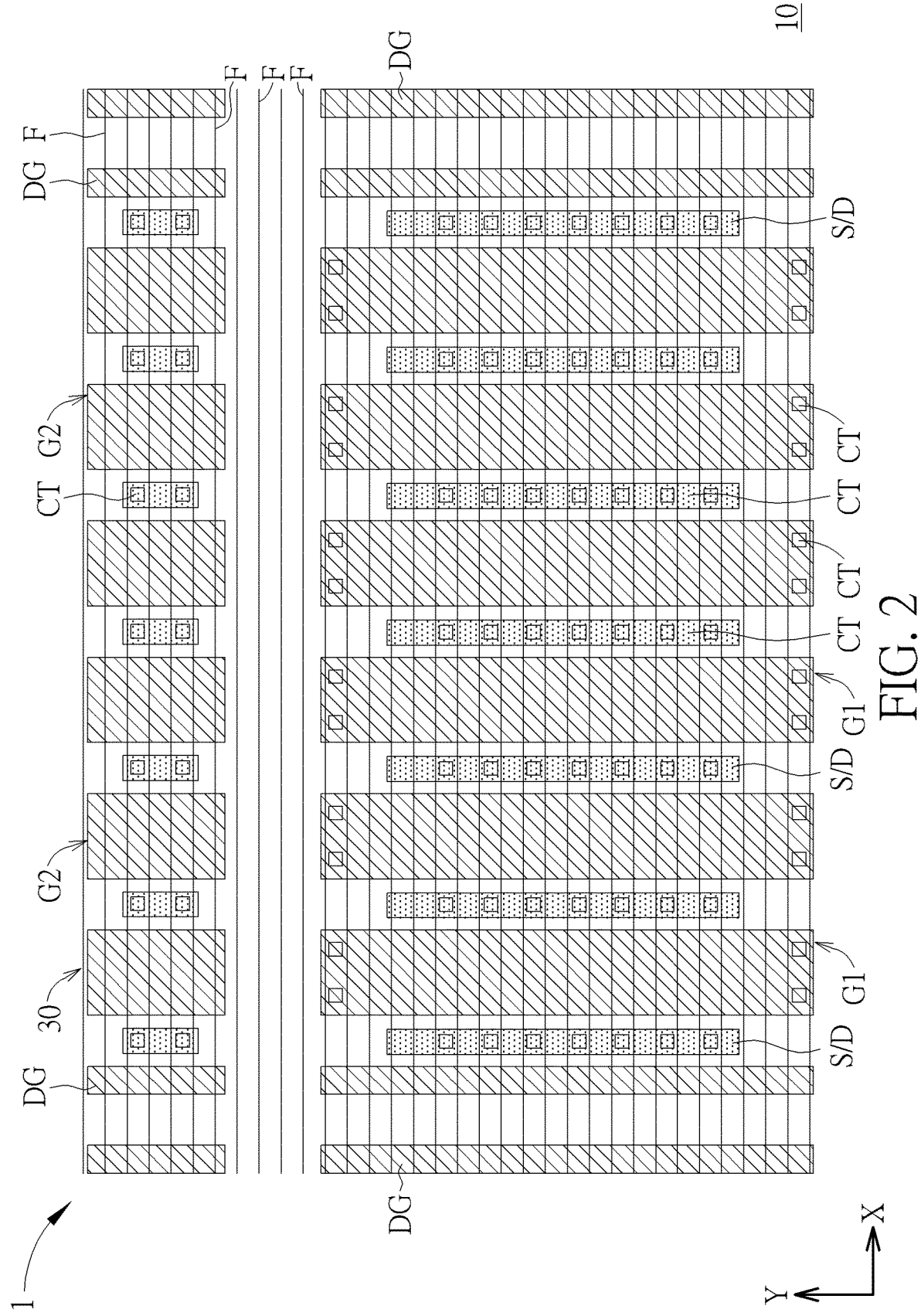
FIG. 2 shows a partially enlarged schematic diagram of a metal-insulating-silicon varactor (MISVAR) provided by the present invention.
Figure 3:
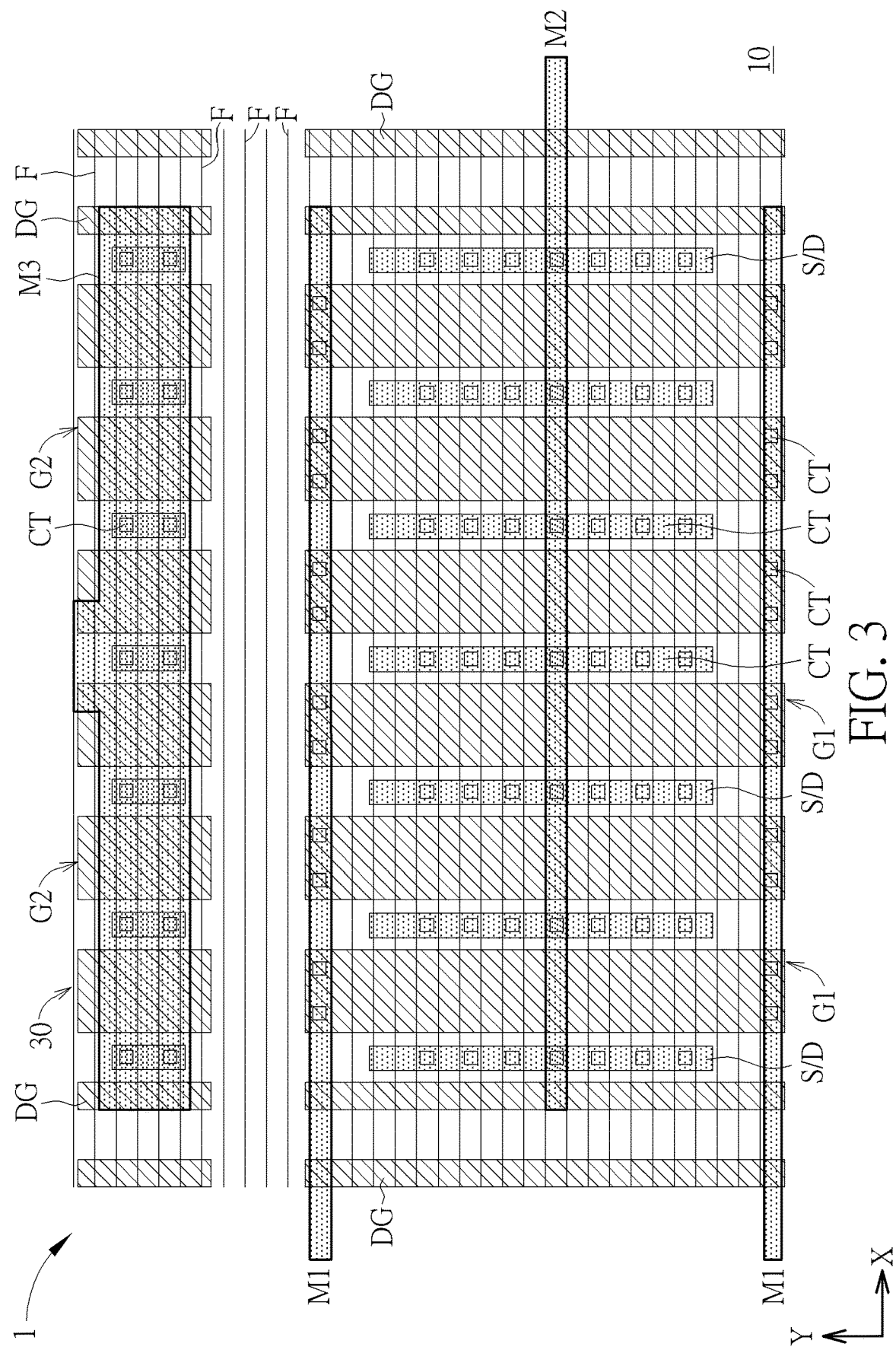
FIG. 3 is a schematic diagram of the metal-insulator-silicon varactor shown in FIG. 2 after forming a metal layer.

Please refer to FIG. 2 and FIG. 3. FIG. 2 shows a partially enlarged schematic diagram of a metal-insulating-silicon varactor (MISVAR) provided by the present invention. FIG. 3 is a schematic diagram of the metal-insulator-silicon varactor shown in FIG. 2 after forming a metal layer. As shown in FIG. 2, a varactor unit VU contains a plurality of fin structures F arranged in parallel. In this embodiment, each fin structure F is arranged in parallel along a first direction (e.g., Y axis), and each fin structure F extends along a second direction (e.g., X direction). In addition, a plurality of first gate structures G1 are arranged parallel to each other along the second direction, and span a plurality of fin structures F. The two sides of each first gate structure G1 also include source/drain regions S/D. In addition, it includes a plurality of contact structures CT, which are formed on each first gate structure G1 and each source/drain region S/D, and are used for connecting the subsequently formed metal layers. As shown in FIG. 3, a metal layer M1 and a metal layer M2 are subsequently formed across the first gate structures G1, wherein the metal layer M1 electrically connects the plurality of first gate structures G1 and the first port P1, while the metal layer M2 electrically connects a plurality of source/drain regions S/D and the second port P2. Therefore, in this embodiment, each of the first gate structures G1 is connected by the metal layer M1 and has the same potential with each other, and similarly, the source/drain regions S/D are connected by the metal layer M2 and have the same potential with each other. In practical application, the first port P1 and the second port P2 can respectively apply voltages to change the potential between the first gate structure G1 and the source/drain region S/D, thereby changing the capacitance of the whole metal-insulator-silicon varactor 1.

In addition, FIG. 2 and FIG. 3 also include another well pickup structure 30, which is arranged on both sides of the metal-insulator-silicon varactor 1, that is, on both sides of a plurality of varactor units VU (for example, the upper and lower sides in FIG. 1). Each well pickup structure includes a plurality of fin structures F, a plurality of second gate structures G2 and a metal layer M3. In this embodiment, the length of the second gate structure G2 is shorter than the length of the first gate structure G1, the second gate structure spans a plurality of fin structures F, and the metal layer M3 spans a plurality of second gate structures G2, and the metal layer M3 is electrically connected to a voltage source or a grounding signal for grounding the metal-insulator-silicon varactor 1 or providing a fixed bias voltage.

In addition, each varactor unit VU may contain at least one dummy gate structure DG in addition to the plurality of first gate structures G1. In this embodiment, each varactor unit VU includes dummy gate structures DG on both sides of the second direction (X direction), that is, on the left and right sides of the plurality of first gate structures G1. The purpose of forming the dummy gate structure DG is to reduce the influence of pattern density difference in the process of forming the gate structure, in other words, forming the dummy gate structure DG is helpful to improve the quality of the whole first gate structure G1. In addition, in this embodiment, the left and right sides of the second gate structure G2 in the well pickup structure 30 may also include dummy gate structures DG, but the present invention is not limited to this. In other embodiments, the dummy gate structure DG may not be formed, or may be formed in part or all of the varactor units VU, but not in the well pickup structure 30. All the above embodiments are within the scope of the present invention.

It is worth noting that in the above embodiment, although a plurality of fin structures F are used as active regions, the present invention can also choose planar doped regions instead of each fin structure F as active regions, and this embodiment also belongs to the scope of the present invention.

The layout of the metal-insulator-silicon varactor according to the first preferred embodiment of the present invention is shown in the above FIG. 1 to FIG. 3. Compared with the conventional varactor layout pattern, the present invention has a plurality of first gate structures G1 arranged across a plurality of fin structures F, each first gate structure G1 is connected to the first port P1 by the metal layer M1, and each source/drain region S/D is connected to the second port P2 by the metal layer M2. The interconnection of the first gate structures G1 helps to increase the capacitance variation range of the whole metal-insulator-silicon varactor, that is, under different voltages, the variation range of capacitance will be more obvious, so it has wider applications.

Figure 4:
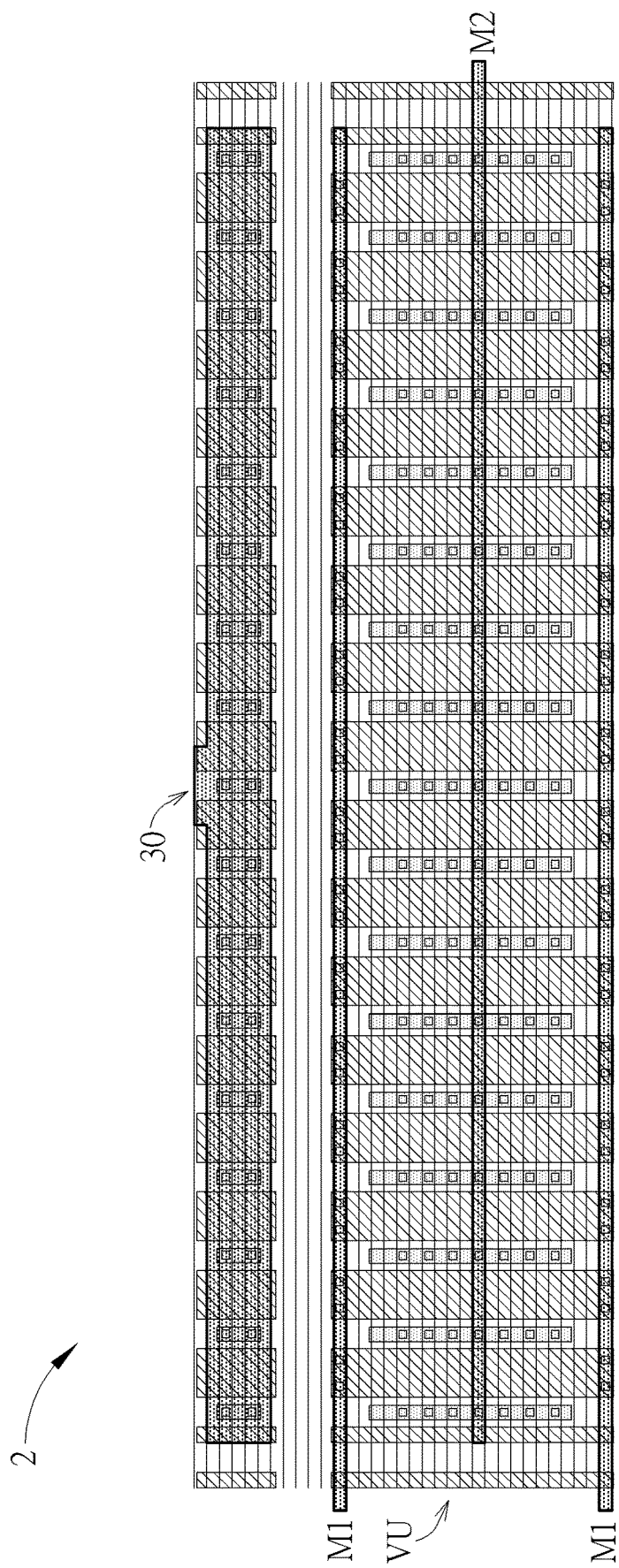
FIG. 4 is a partial top view of a metal-insulating-silicon varactor (MISVAR) according to another embodiment of the present invention.

In the metal-insulator-silicon varactor 1 shown in FIG. 1 to FIG. 3 above, each varactor unit VU contains six first gate structures G1 (excluding the dummy gate structures DG on the left and right sides) across a plurality of fin structures F, and one metal-insulator-silicon varactor 1 contains 16 varactor units VU arranged along the first direction (Y direction). However, in other embodiments of the present invention, the number of varactor units VU or the number of first gate structures G1 can also be changed accordingly. Generally speaking, if the number of the first gate structures G1 is increased, the capacitance variation range of the metal-insulator-silicon varactor can be correspondingly increased. For example, FIG. 4 shows a partial top view of a metal-insulating-silicon varactor (MISVAR) according to another embodiment of the present invention. In the metal-insulator-silicon varactor 2 shown in FIG. 4, each varactor unit VU includes 16 first gate structures G1, and the well pickup structure 30 correspondingly includes 16 second gate structures G2. The remaining features are basically the same as those of the first embodiment, so the redundant description will not be repeated. It should be noted that in other embodiments of the present invention, the number of the first gate structures G1 (and the second gate structures G2) may be more or less, such as 32 or 64, but it is not limited to this.

According to the above description and drawings, the present invention provides a layout pattern of semiconductor varactor, which comprises a plurality of varactor units VU arranged on a substrate 10, wherein each varactor unit VU comprises a plurality of fin structures F, the fin structures F are arranged in parallel with each other, the first gate structures G1 are arranged in parallel with each other, the first gate structures G1 are located on the substrate 10 and span the fin structures F, and a gate metal layer (i.e., the metal layer M1) is electrically connected with the first gate structures G1.

In some embodiments of the present invention, the gate metal layer M1 is electrically connected to a first port P1.

In some embodiments of the present invention, there are a plurality of source/drain regions S/D located between the first gate structures G1.

In some embodiments of the present invention, it further includes a source/drain metal layer (i.e., the metal layer M2) electrically connected to a plurality of source/drain regions S/D.

In some embodiments of the present invention, the source/drain metal layer M2 is electrically connected to a second port P2.

In some embodiments of the present invention, at least one well pickup structure 30 is further included, which is located beside a plurality of varactor units VU.

In some embodiments of the present invention, the well pickup structure 30 includes a plurality of second gate structures G2, wherein a length of the second gate structures G2 is smaller than a length of the first gate structures G1 in the varactor unit VU.

In some embodiments of the present invention, in each varactor unit VU, the number of the first gate structures G1 is greater than 6.

In some embodiments of the present invention, there are a plurality of dummy gate structures DG located on both sides of the first gate structures G1.

In some embodiments of the present invention, the semiconductor varactor 1 includes a plurality of varactor units VU arranged on the substrate 10 along a first direction (Y direction), and the fin structure F extends along a second direction (X direction), wherein the first direction and the second direction are perpendicular to each other.

The invention also provides a manufacturing method of layout pattern of semiconductor varactor, which comprises forming a plurality of varactor units VU arranged on a substrate 10, wherein each varactor unit VU comprises a plurality of fin structures F, the fin structures F are arranged in parallel with each other, a plurality of first gate structures G1 are arranged in parallel with each other, the first gate structures G1 are located on the substrate 10 and span the fin structures F, and a gate metal layer M1 is electrically connected with the plurality of first gate structures G1.

The feature of the present invention is to provide a novel metal-insulating-silicon varactor (MISVAR), which has a plurality of varactor units arranged on a substrate along a first direction (e.g., Y direction), and a plurality of gate structures arranged along a second direction (e.g., X direction) in each varactor unit. Increasing the number of gate structures will also help to increase the capacitance change range of varactor, and make the capacitance value change more obviously under different voltage frequencies. In other words, the present invention provides a novel layout pattern of a MISVAR and its manufacturing method.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout pattern of a semiconductor varactor, comprising:
   a plurality of varactor units are arranged on a substrate, wherein each varactor unit comprising:
   a plurality of fin structures which are arranged in parallel with each other;
   a plurality of first gate structures arranged in parallel with each other, located on the substrate and spanning the plurality of fin structures; and
   a gate metal layer electrically connected to the plurality of first gate structures; and
   at least one well pickup structure located next to the varactor units, wherein the well pickup structure includes a plurality of second gate structures, wherein a length of the second gate structures is smaller than a length of the first gate structures in the varactor unit.

2. The layout pattern of the semiconductor varactor according to claim 1, wherein the gate metal layer is electrically connected to a first port.

3. The layout pattern of the semiconductor varactor according to claim 1, further comprising a plurality of source/drain regions located between the first gate structures.

4. The layout pattern of the semiconductor varactor according to claim 3, further comprising a source/drain metal layer electrically connected to the source/drain regions.

5. The layout pattern of the semiconductor varactor according to claim 4, wherein the source/drain metal layer is electrically connected to a second port.

6. The layout pattern of the semiconductor varactor according to claim 1, wherein the number of the first gate structures in each varactor unit is greater than 6.

7. The layout pattern of the semiconductor varactor according to claim 1, further comprising a plurality of dummy gate structures located on both sides of the first gate structures.

8. The layout pattern of the semiconductor varactor according to claim 1, wherein the semiconductor varactor includes a plurality of varactor units arranged on the substrate along a first direction, and the fin structure extends along a second direction, wherein the first direction and the second direction are perpendicular to each other.

9. A method for manufacturing a layout pattern of a semiconductor varactor, comprising:
   forming a plurality of varactor units which are arranged on a substrate, wherein each varactor unit comprising:
   a plurality of fin structures which are arranged in parallel with each other;
   a plurality of first gate structures arranged in parallel with each other, located on the substrate and spanning the plurality of fin structures;
   a gate metal layer electrically connected to the first gate structures; and
   forming at least one well pickup structure located next to the varactor units, wherein the well pickup structure includes a plurality of second gate structures, wherein a length of the second gate structures is smaller than a length of the first gate structures in the varactor unit.

10. The manufacturing method of the layout pattern of the semiconductor varactor according to claim 9, wherein the gate metal layer is electrically connected to a first port.

11. The manufacturing method of the layout pattern of the semiconductor varactor according to claim 9, further comprising forming a plurality of source/drain regions between the first gate structures.

12. The manufacturing method of the layout pattern of the semiconductor varactor according to claim 11, further comprising forming a source/drain metal layer electrically connecting the source/drain regions.

13. The manufacturing method of the layout pattern of the semiconductor varactor according to claim 12, wherein the source/drain metal layer is electrically connected to a second port.

14. The manufacturing method of the layout pattern of the semiconductor varactor according to claim 11, wherein the number of the first gate structures in each varactor unit is greater than 6.

15. The manufacturing method of the layout pattern of the semiconductor varactor according to claim 11, further comprising forming a plurality of dummy gate structures on both sides of the first gate structures.

16. The manufacturing method of the layout pattern of the semiconductor varactor according to claim 11, wherein the semiconductor varactor comprises a plurality of varactor units arranged on the substrate along a first direction, and the fin structure extends along a second direction, wherein the first direction and the second direction are perpendicular to each other.

* * * * *